United States Patent [19]

Matsuda et al.

[11] Patent Number: 5,286,523
[45] Date of Patent: Feb. 15, 1994

[54] METHOD OF PROCESSING SUBSTRATES AND SUBSTRATE PROCESSING APPARATUS

[75] Inventors: Tetsuo Matsuda; Yuuichi Mikata, both of Kawasaki; Akimichi Yonekura, Yokohama, all of Japan

[73] Assignee: Kabushiki Kaisha Toshiba, Kawasaki, Japan

[21] Appl. No.: 750,601

[22] Filed: Aug. 27, 1991

[30] Foreign Application Priority Data

Aug. 29, 1990 [JP] Japan ................... 2-229219

[51] Int. Cl.$^5$ ............................................. C23C 16/00
[52] U.S. Cl. .................................................. 427/248.1
[58] Field of Search ................. 427/248.1, 255, 255.1, 427/255.2, 255.3

[56] References Cited

U.S. PATENT DOCUMENTS

| | | | |
|---|---|---|---|
| 4,517,220 | 5/1985 | Rose | 427/248.1 |
| 4,910,042 | 3/1990 | Hokynar | 118/725 |

FOREIGN PATENT DOCUMENTS

| | | |
|---|---|---|
| 0371854 | 6/1990 | European Pat. Off. . |
| 1549845 | 8/1979 | United Kingdom . |

OTHER PUBLICATIONS

J. Sato & K. Maeda, "Very Low Temperature CVD of SiO$_2$ Films Using Ozone and Organosilane", *Electrochemical Society Spring Meeting*, Abstract No. 9, May 1971, pp. 31-33.

*Primary Examiner*—Shrive Beck
*Assistant Examiner*—David Maiorana
*Attorney, Agent, or Firm*—Oblon, Spivak, McClelland, Maier & Neustadt

[57] ABSTRACT

In a CVD apparatus, an epitaxial apparatus or an etching apparatus, the processing conditions are made uniform in a batch process by changing, with time, positions which are disposed in the direction of a gas flow in a reaction vessel and at which the optimal surface processing conditions are attained. By doing so, homogeneous and uniform films can be formed with a large substrate processing apparatus.

6 Claims, 7 Drawing Sheets

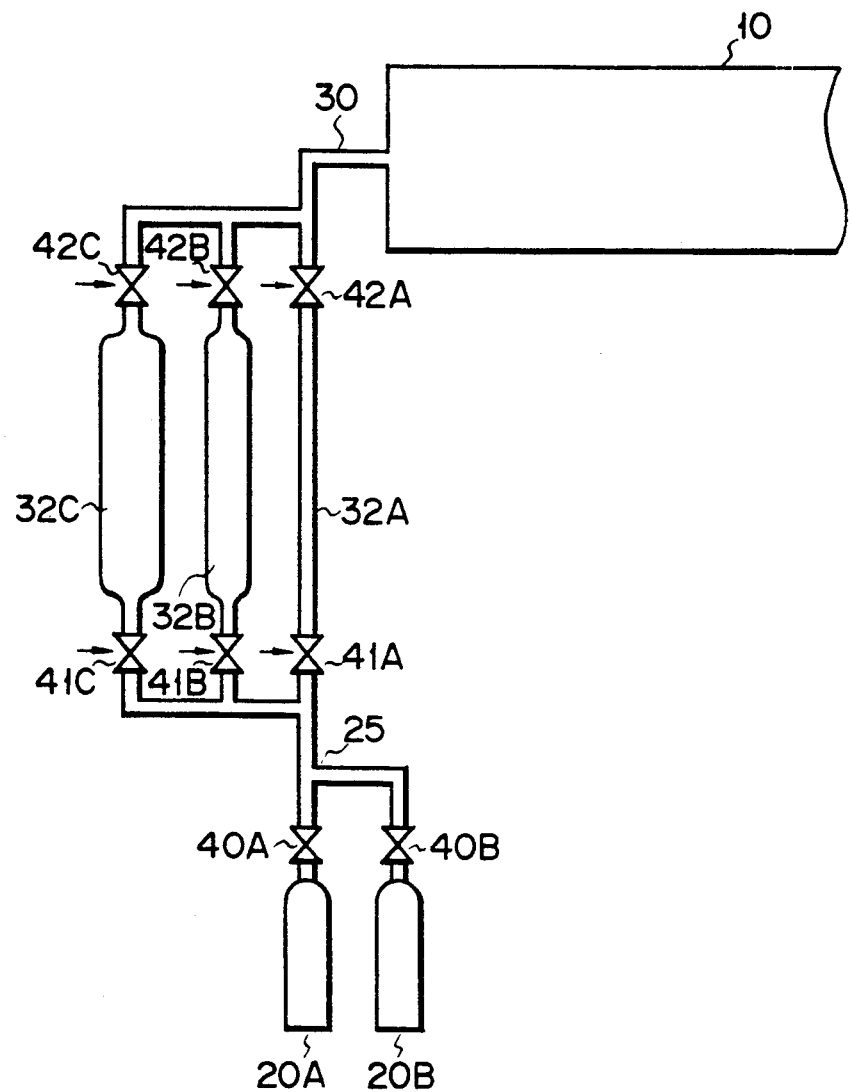
F I G. 6

METHOD OF PROCESSING SUBSTRATES AND SUBSTRATE PROCESSING APPARATUS

BACKGROUND OF THE INVENTION

1. Field of the Invention

This invention relates to a method of processing substrates and a substrate processing apparatus, utilized to produce semiconductor devices, such as a method of processing substrates and a substrate processing apparatus for forming films by the use of gas or the like or by means of ashing process, and more particularly to a batch type method of processing substrates and substrate processing apparatus.

2. Description of the Related Art

Semiconductor devices have been fabricated by means of thin film formation processes utilizing the vapor phase deposition method (the CVD method) due to vapor phase reactions, the epitaxial growth method and the like. Further, etching and ashing have been widely used. Particularly, the batch process which processes a plurality of substrates in one lot has frequently been used as a method having high productivity.

When the batch process is used, however, variation occurs in surface process of substrates. For example, in forming thin films on a plurality of substrates, the thickness and quality of the films vary. The variation occurs due to the fact that surface processing conditions are delicately changed according to the positions of the substrates arranged in a reaction vessel.

The reason why the variation occurs when thin films are formed will now be explained. In the CVD method and the epitaxial growth method, surface processing is carried out by a reaction caused by energy of heat, light, plasma or the like, decomposition of gas introduced in the reaction vessel, or a reaction of gas on the substrates. In the batch process, substrates are generally arranged in the direction of the flow of the gas introduced in the reaction vessel. The time interval of energy exposure to substrates at the upstream side of the gas flow is different from the time interval of energy exposure to substrates at the downstream side of the gas flow. Further, when a plurality of gases are mixed with each other in the reaction vessel, the mixed gas arrives at respective substrates at different time. In this connection, the degrees of the deposition or reaction of the gas (gaseous species) differ at different positions of the substrates. The process of CVD at lower temperatures is reported in J. Sato and K. Maeda: *VERY LOW TEMPERATURE CVD OF SiO₂ FILMS USING OZONE AND ORGANOSILANE* (Electro Chemical Society, Spring Meeting, Abstract No. 9, pp. 31-33, May 1971).

As described above, the conventional batch process is encountered with a problem that the surface-processed states of substrates vary.

SUMMARY OF THE INVENTION

The object of this invention is to provide a method of processing substrates and a substrate processing apparatus by means of which the uniformity of the surface-processed states of a plurality of substrates can be improved.

According to one aspect of this invention, a method of performing predetermined surface process on a surface of each of a plurality of substrates comprises the step of performing predetermined surface process by causing a plurality of kinds of predetermined gas to flow into a reaction vessel in the direction in which a plurality of substrates are arranged in the reaction vessel. When the substrates are surface-processed in batch, the surface processing conditions of the substrates are made uniform by changing, with time, those positions in the reaction vessel at which optimal surface processing conditions are attained.

According to another aspect of this invention, a substrate processing apparatus comprises a reaction vessel in which a plurality of substrates are arranged, means for causing predetermined gas to flow in a direction in which the substrates are arranged and supplying the gas into the reaction vessel so as to perform predetermined surface process on the substrates, and means for changing, with time, those positions in the reaction vessel at which optimal surface processing conditions are attained.

In this invention, the optimal surface processing conditions are defined as the conditions in which the vapor phase reaction of the supplied gas occurs on the surfaces of required substrates in the best state. In most cases, while mixed gas is being supplied to the reaction vessel, the state of the vapor phase reaction of the mixed gas satisfies the optimal surface processing condition a certain time after the gases have been mixed with each other. This means that the degrees of decomposition or reaction of gas are different at the different positions of the substrates in the reaction vessel and this produces variation in the batch process of substrates.

In this invention, the time interval during which gas as gaseous phase species is exposed to heat, light, plasma, or the like and/or the time interval after gases have been mixed is controlled by, for example, means for changing the speeds of gas in a reaction vessel with time. Since this arrangement allows the positions of substrates in the reaction vessel to be changed with time and the optimal surface processing conditions for film formation or the like in the reaction vessel can be changed with time, the film forming conditions for the substrates in the reaction vessel are equalized such that uniform films are obtained. Consequently, the variation of the thickness and quality of films is reduced by the method and apparatus according to this invention.

It follows that, when this invention is applied to the batch process, the surface processing conditions of a plurality of substrates in the reaction vessel can be equalized by changing, with time, positions in which the optimal surface processing conditions are attained and thus the substrates can be surface-processed at high uniformity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 shows the structure of a substrate processing apparatus according to the second embodiment of this invention.

DETAILED DESCRIPTION OF THE PREFERRED EMBODIMENTS

This invention will now be explained by way of preferred embodiments with reference to the accompanying drawings.

Figure 1:
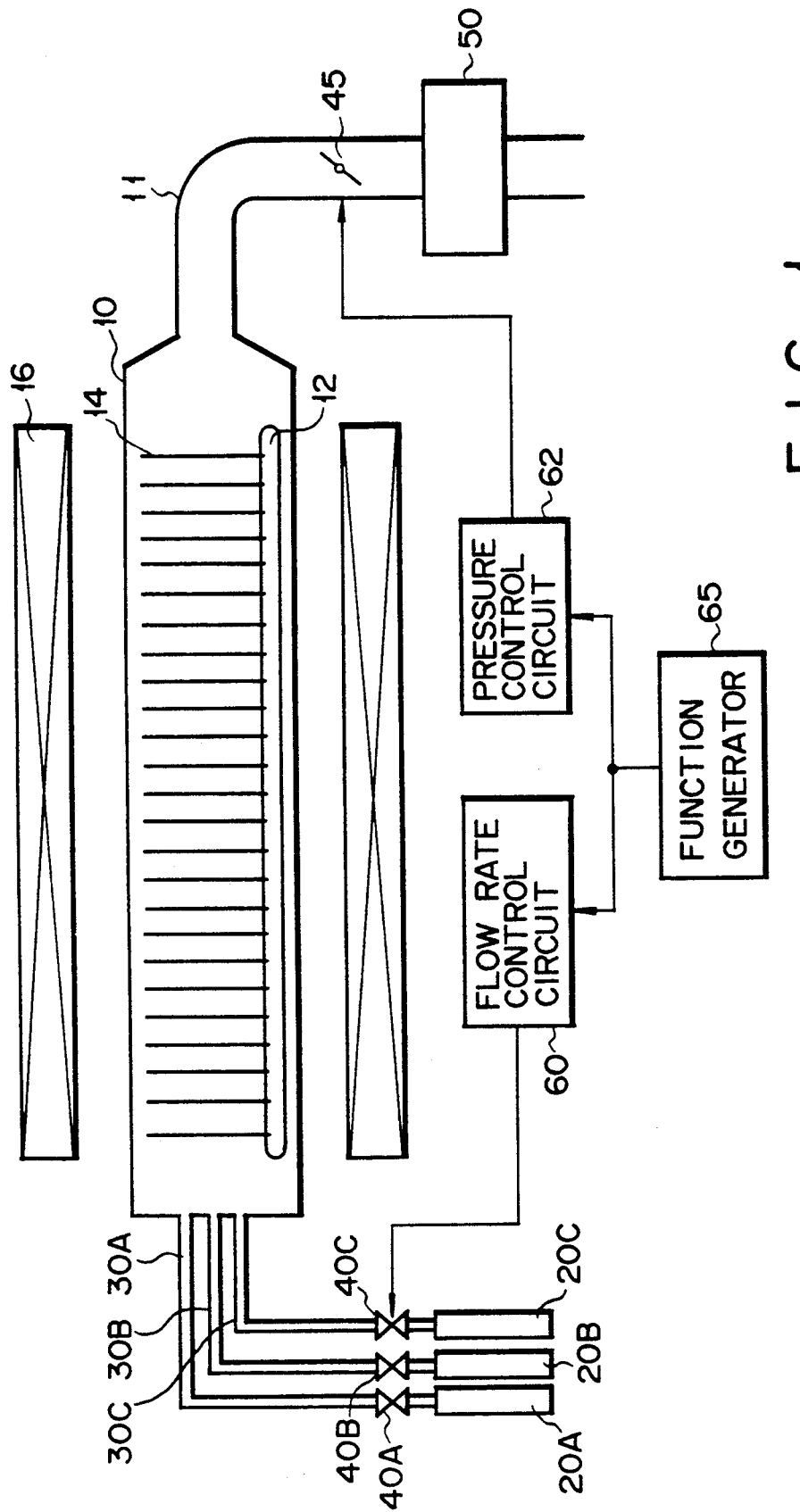
FIG. 1 shows the structure of a substrate processing apparatus according to the first embodiment of this invention.

FIG. 1 shows a structure of a barrel type substrate processing apparatus according to the first embodiment of this invention and employing a reduced pressure CVD method. It will now be explained how to form silicon oxide films on silicon monocrystal wafers.

A reaction vessel 10 is made of quartz and has an inner diameter of 16 cm. A great number of silicon wafer 14 having a diameter of 10 cm are arranged on a quartz board 12 provided in the reaction vessel 10. A resistance heater 16 surrounds the reaction vessel 10. One end portion of the reaction vessel 10 are connected gas introducing tubes 30A, 30B and 30C to which gas sources 20A, 20B and 20C are fixed, respectively, through valves 40A, 40B and 40C. In this embodiment, the gas source 20A contains gaseous ethyl silicate (tetraethoxysilane, abbreviated as TEOS), the gas source 20C contains nitrogen gas and the gas source 20B contains oxygen or/and ozone gas the other end portion of the reaction vessel 10 is connected an exhaust tube 11 to which a rotary pump 50 is connected through a pressure control valve 45.

The control system of the substrate processing apparatus of this embodiment comprises a function generator 65 for producing signals which changes the gas flow rates, a flow rate control circuit 60 for receiving the signals from the function generator 65 and producing the opening/closing signals of a valve 40C so as to control the flow rates of nitrogen gas, and a pressure control circuit 62 for causing a pressure control valve 45 to control the pressure in the reaction vessel 10.

It will now be explained how to form oxide films by using this apparatus. The interior of the reaction vessel 10 is exhausted and silicon wafers 14 are heated to a high temperature such as 380° C. by means of the resistance heater 16. Simultaneously introduced into the reaction vessel 10 are TEOS at a flow rate of 200 cc/min, oxygen at a flow rate of 10,000 cc/min and nitrogen at a flow rate of Q cc/min. The gases introduced into the reaction vessel 10 travel on the silicon wafers 14 and are exhausted from the exhaust tube 11.

The pressure in the reaction vessel 10 is controlled to 100 Torr by controlling the degree of opening of the pressure control valve 45.

In order to form oxide films under the above-described conditions in this embodiment, the mixed gas speed v is changed with time by altering the flow rate Q of nitrogen with time by means of the function generator 65 and the flow rate control circuit 60. At the same time, the pressure control valve 45 is controlled by means of the function generator 65 and a control valve control circuit 62 in synchronism with the flow rate change of nitrogen such that the pressure in the reaction vessel 10 remains constant.

The mixed gas speed v in the reaction vessel 10 is expressed by:

V = (the amount of total gas flow in the atmosphere per unit time)/(actual pressure)/(flow passage area)

Here, the flow passage area is the substantial cross-sectional area of the gas flow passage in the reaction vessel 10 in which the gas flows as a viscous flow. When the silicon wafers 14 are arranged at small intervals in the reaction vessel 10, the flow passage area is the cross-sectional area defined between the outer surface of each wafer and the inner face of the reaction vessel 10 minus the cross-sectional area of the quartz board.

If the sum of the wafer area and the cross-sectional area of the quartz board is estimated to be 100 cm$^2$, the mixed gas speed v in the reaction vessel 10 is expressed by:

$$v = (200 + 10000 + Q)/(100/760)/(\pi 8^2 - 100)[cm/min] \quad (1)$$
$$= (10200 + Q)/797[cm/sec]$$

Time t required for delivering gas by the distance D from the gas inlet and the gas outlet of the reaction vessel 10 is expressed by:

$$t = D/v \quad (2)$$
$$= 797D/(10200 + Q)[sec]$$

Figure 2:
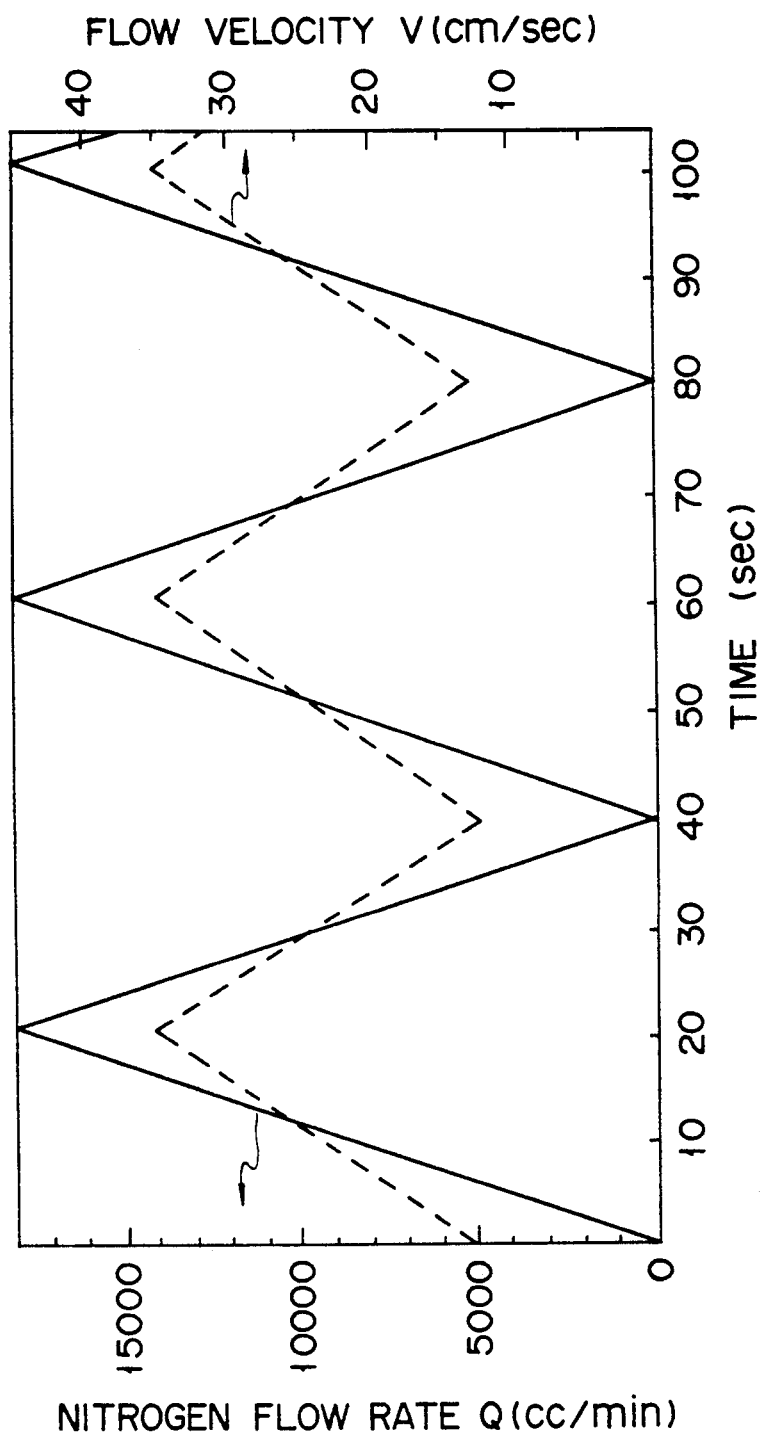
FIG. 2 is a graph showing the change of nitrogen flow rates and gas speeds changing with time in the embodiment shown in FIG. 1.

In FIG. 2, the solid lines show a time-changing oscillatory waveform of nitrogen flow rate Q used in this embodiment and the dot lines illustrate the change of the mixed gas speed v in the reaction vessel 10 according to equation (1).

Figure 3:
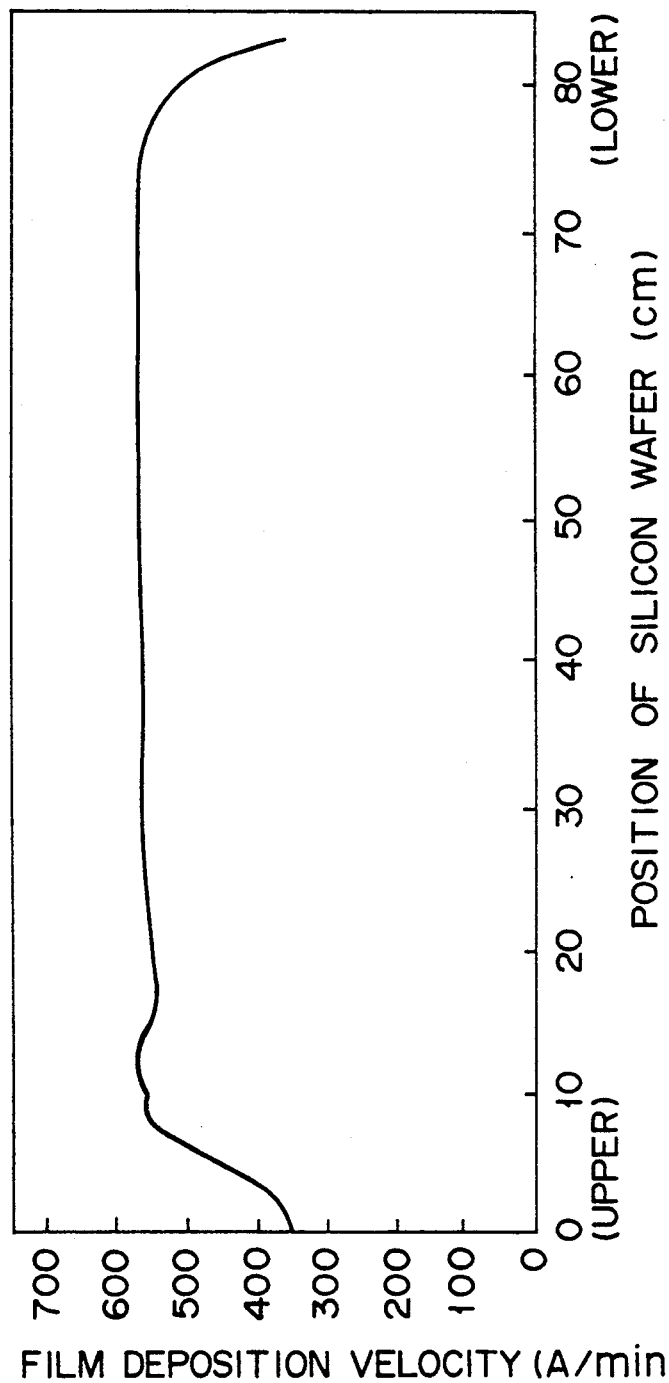
FIG. 3 shows a distribution of film deposition speeds of the embodiment shown in FIG. 1, in the reaction vessel.
Figure 4:
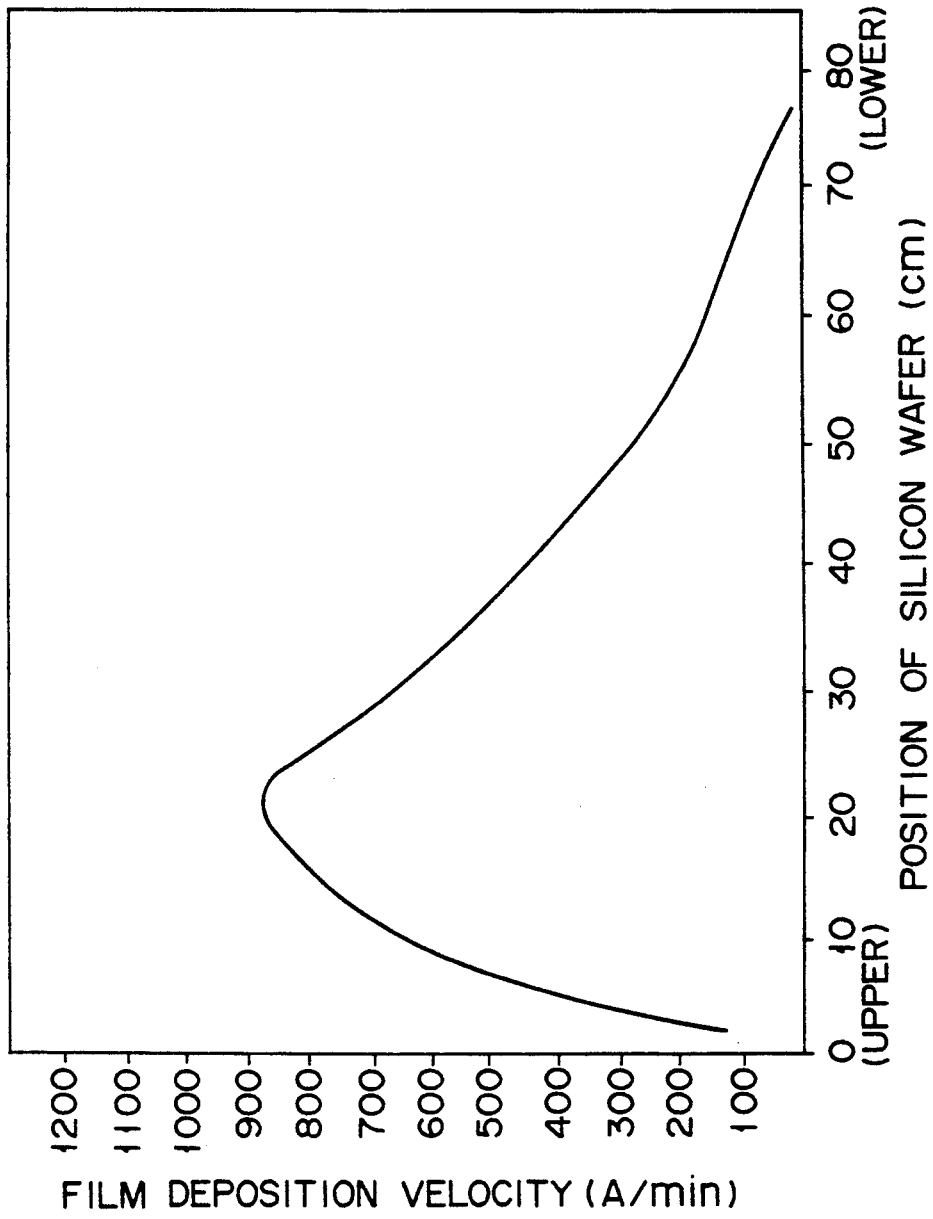
FIG. 4 is a graph showing a distribution of film deposition speeds in the reaction vessel, with the gas speed fixed.

FIG. 3 shows the dependency of the oxide film formation speeds at the positions of the substrates in the reaction vessel 10 when the oxide films are formed under the conditions as shown in FIG. 2. In FIG. 4, as a reference, is shown the dependency of the oxide film formation speeds at the positions of the substrates in the reaction vessel, under the same conditions as those of this embodiment, except that the nitrogen flow rate Q is fixed to 6,000 cc/min.

As seen from FIG. 3, the film formation speeds of this embodiment are uniform except at both end portions of the reaction vessel 10. When the nitrogen flow rate is fixed, the film formation speed is the maximum at the position at which D is about 20 cm, and is rapidly reduced when it approaches the upstream side end and the downstream side end.

Figure 5:
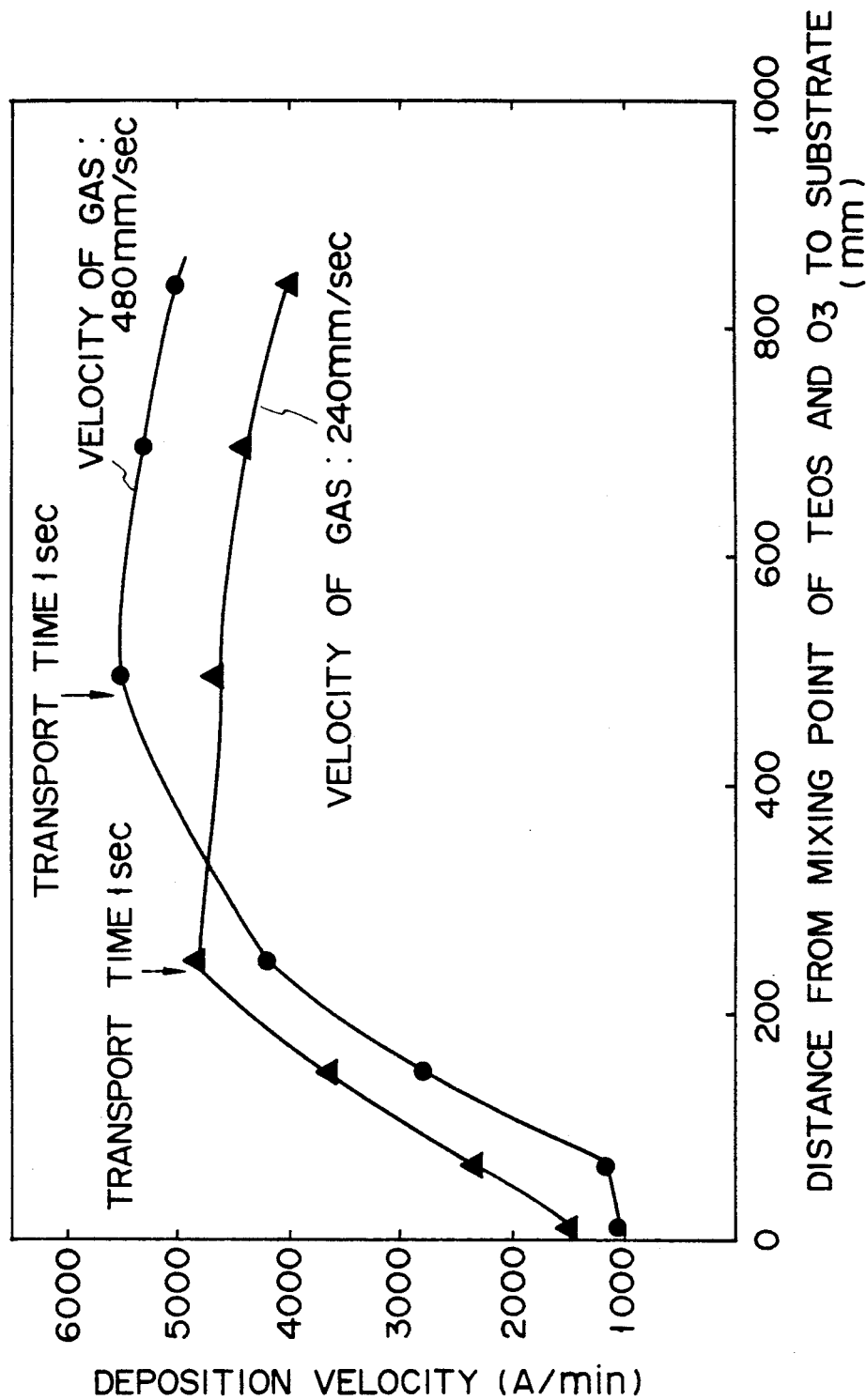
FIG. 5 is a graph showing the relationship between the film deposition speeds and the distances between the mixing point and the substrates, with the gas speed fixed.

There will now be explained why such uniform film formation speed is attained. From an experiment, it was found that it takes about 1 second for TEOS and ozone to react in a vapor phase to contribute to the film formation (see FIG. 5). (For example, time t, which is the time required for transferring gas from the gas inlet to the gas outlet in the reaction vessel 10, is 0.984 sec when Q=6,000 cc/min and D=20 cm in Equation (2).) When, therefore, TEOS and ozone are mixed with each other, they react to form a product which contributes to film formation at the position about 20 cm separated from the gas inlet in the reaction vessel. A sufficient amount of product is not produced at the upstream side of this position and an reaction product produced at the downstream side is deactivated. This results in a film deposition speed distribution as shown in FIG. 4.

When, on the contrary, the gas speeds can be changed in the reaction vessel as in the first embodiment, the positions at which the film deposition conditions become optimal are changed periodically in the directions of the gas flow in the reaction vessel. As a result, the deposition conditions such as film deposition speeds are made uniform in a wide range in the reaction vessel.

In the embodiment described above, only the flow rate of nitrogen gas is controlled. But if the flow rate TEOS and the flow rate of oxygen and/or ozone gas are also simultaneously controlled with the ratio of these gas flow constant independently of the time, a better result can be attained.

In this case, the apparatus showed in FIG. 1 can be changed as a apparatus, wherein the flow rate control circuit 60 is connected to the gas sources 20A, 20B and 20C. In this apparatus the flow rate of each gas is controlled as is described previously by the flow rate control circuit 60. Moreover the mixed gas speed can be written as follows.

$$V = (Q_A + Q_B + Q_C)/(100/760)/(\pi 8^2 - 100)[cm/min]$$
$$= (Q_A + Q_B + Q_C)/797[cm/sec]$$

In this formula $Q_A$ is the flow rate of TEOS, $Q_B$ is the flow rate of oxygen and/or ozone gas, $Q_C$ is the flow rate of nitrogen gas.

In the first embodiment, the positions, at which the best films are formed from the decomposed or reacting gas introduced in the reaction vessel, are changed by altering the gas speed in the reaction vessel. However, the positions at which the best films are formed can be changed in the reaction vessel even if the mixed gas flow remains constant in the reaction vessel, as explained below.

FIG. 6 shows the structure of the second embodiment of a CVD type film forming apparatus, which is provided with gas sources 20A and 20B. The flow rates of gases in the gas sources 20A and 20B are regulated and then the gases are mixed together at a gas mixing point 25 which is located outside of the reaction vessel 10 and at which the gas decomposition starts. Between the mixing point 25 and the gas inlet of the reaction vessel 10 are arranged a plurality of gas supplying tubes 32A, 32B and 32C which have diameters different from each other. The connection and disconnection between the gas mixing point 25, and the gas supplying tubes 32A, 32B and 32C are made by valves 41A, 42A and 43C, respectively.

When, for example, substrates are processed by the above-mentioned apparatus in the same way as in the first embodiment, the connection between the mixing point 25 and the gas supplying tubes 32A, 32B and 32C is carried out in turn by the valves 41A, 41B and 41C in a constant time. In other words, the flow paths of the mixed gas from the gas mixing point 25 are opened by the valves 41A, 41B and 41C in turn. Since the diameters of the gas supplying tubes 31A, 31B and 31C are different from each other, the mixed gas speeds in these tubes are also different from each other. Thus, the positions, at which the states of decomposition or reaction satisfy the optimal deposition conditions, are changed according to the amounts of the gas supply from the gas supplying tubes. Just like in the previous embodiment, the problem of the positional dependency of the film deposition conditions on the mixed gas speeds is dissolved even if the mixed gas speed remains constant in the reaction vessel 10.

Figure 7:
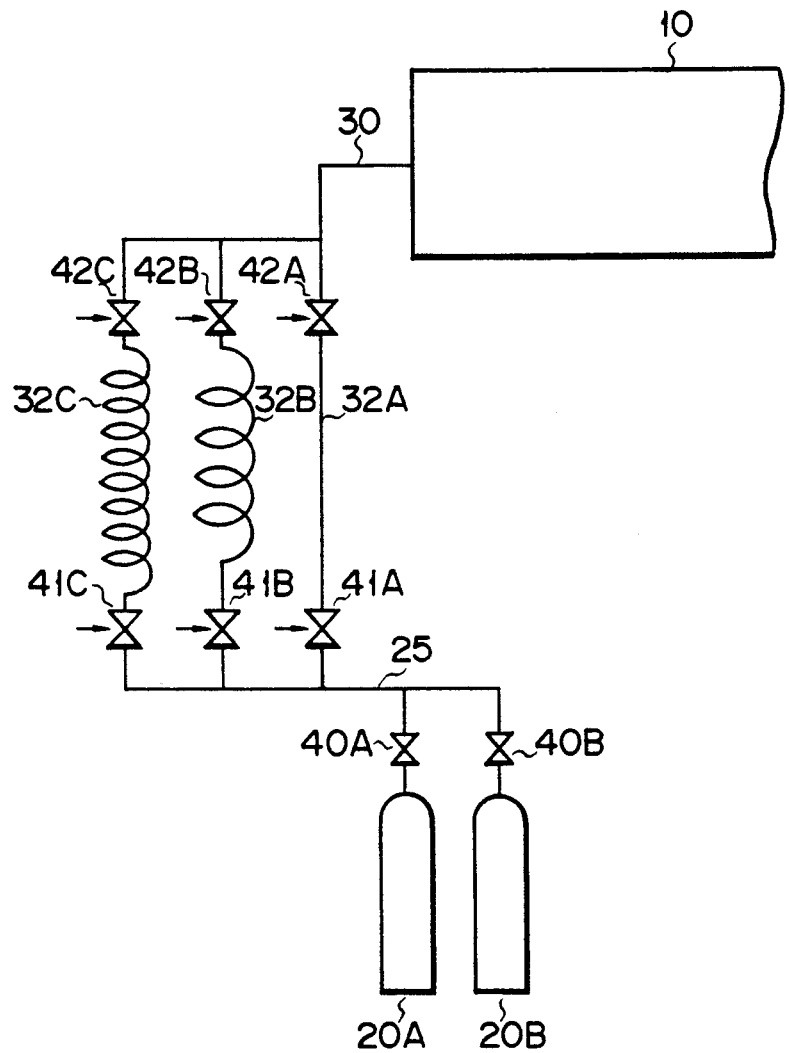
FIG. 7 shows the structure of a substrate processing apparatus according to the third embodiment of this invention.

FIG. 7 shows the third embodiment modified from the second embodiment as shown in FIG. 6. This embodiment differs from the embodiment as shown in FIG. 6 in that a plurality of gas supplying tubes 32A, 32B and 32C having different lengths are used. Like in the embodiment as shown in FIG. 6, the decomposition of the mixed gas starts at the gas mixing point 25. Similarly to the embodiment as shown in FIG. 6, the traveling time of the mixed gas from the gas mixing point 25 to the reaction vessel 10 varies with the amounts of the mixed gas supplied from the tubes 32A, 32B and 32C. Accordingly, the film deposition conditions in the reaction vessel 10 are made uniform by causing the gas supplying tubes 32A, 32B and 32C to communicate with the gas sources 20A and 20B in turn, similarly to the embodiment as shown in FIG. 6.

In second and third embodiment in the invention, gas flow rate remains constant in a reaction vessel, but, since period of gas flow is changed between gas mixing point 25 and gas introduced portion of reaction vessel, similar effect to first embodiment is obtained.

Further, in the second and third embodiment, if gas source has either one kind of gas or more, gas mixing point 25 is identified as gas reaction starting point 25.

This invention is not limited to the above-mentioned embodiments.

For example, the pressure in the reaction vessel is controlled by a pressure control valve in the above-mentioned embodiments, but may be controlled by changing the gas exhausting speed under the control of the rotational speed of a rotary pump.

The gas speed is not always changed by the control of the gas flow rates and gas exhausting speeds but may be changed by other means which varies the pressure of the gas.

The change of the gas speeds is not always made in a linear manner as explained in the above-mentioned embodiments but can be made by using various functions in accordance with the characteristics of a substrate processing apparatus and the required film formation conditions.

Further, the followings are selected as the optimal surface processing conditions:

1) the condition under which a film formation speed is maximum;

2) the condition under which the etching speed of an etched film is minimum;

3) the condition under which the selection ratio between etched materials A and B is maximum in an etching process; and 4) the condition under which the selection ratio between base materials A and B is maximum in the selection epitaxial growth process and the selection CVD process.

Means for forming silicon oxide films due to the reduced pressure CVD method using TEOS and ozone is explained in the above-mentioned embodiments, but the oxide film formation process may be of selection type or of no-selection type. In these cases, it is difficult to form silicon oxide films on hydrophilic material but it is easy to form them on hydrophobic material. Further, various kinds of gas material and thin films can be used. This invention is applicable to:

1) the reduced pressure CVD, plasma CVD, normal pressure CVD, light CVD and epitaxial growth of semiconductor crystals and the like using vapor phase reactions; and 2) substrate surface processing such as etching known as CDE using gas or downflow ashing (more specifically, etching of silicon substrates after exciting fluorocarbon gas by microwaves and transporting the silicon substrates to a reaction vessel disposed downstream by a transportation pipe). In this invention, heat, high frequency waves, microwaves, ion irradiation, electron beam irradiation, molecular beam irradiation, X-ray irradiation, light beam irradiation and the like are effectively used in order to decompose gas for effecting vapor phase reaction.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

What is claimed is:

1. A method of performing a surface process using a gas reaction on a plurality of substrates, comprising:
   a first step of starting a reaction of at least one reactant gas;
   a second step of supplying said reactant gas into a reaction vessel in a direction in which a plurality of substrates are arranged vertically against a direction of said reactant gas flow in said reaction vessel; and
   a third step of changing, with time, an optimal reaction position of said reactant gas in said reaction vessel, wherein said optimal reaction position is the position at which film deposition conditions become optimal.

2. The method according to claim 1, wherein said third step comprises a step of changing the flow rate of said reactant gas so that said optimal reaction position varies with time.

3. A method of performing a surface process using a gas reactant on a plurality of substrates, comprising:
   a first step of preparing at least one reactant gas to be introduced through at least one gas tube into a reaction vessel in a direction in which a plurality of substrates are arranged vertically against a direction of said reactant gas flow in said reaction vessel;
   a second step of starting a reaction of said reactant gas prepared in said first step;
   a third step of changing the time at which said reactant gas reaches said reaction vessel by changing the flow rate of said reactant gas, whose reaction has already started, in order to vary the optimal reaction position within said reaction vessel, wherein said optimal reaction position is the position at which deposition conditions become optimal; and
   a fourth step of introducing said reactant gas, into said reaction vessel.

4. The method according to claim 3, wherein said third step includes a step of changing the width of the cross sections of said gas tube with time.

5. The method according to claim 3, wherein said third step includes a step of changing the length of said gas tube with time.

6. The method according to claim 3, wherein said second step includes a step of mixing said reactant gas with at least another kind of gas to start said reaction.

* * * * *